United States Patent
Poulton

(10) Patent No.: US 9,660,472 B2
(45) Date of Patent: May 23, 2017

(54) WIRELESS COMMUNICATION CONTROLLED BATTERY CHARGING STATION

(71) Applicant: International Business Machines Corporation, Armonk, NY (US)

(72) Inventor: Kevin Poulton, Ottawa (CA)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 14/318,858

(22) Filed: Jun. 30, 2014

(65) Prior Publication Data

US 2015/0380954 A1    Dec. 31, 2015

(51) Int. Cl.
*H02J 7/00*    (2006.01)

(52) U.S. Cl.
CPC ............ *H02J 7/007* (2013.01); *H02J 7/0047* (2013.01); *H02J 7/0052* (2013.01); *H02J 7/0004* (2013.01); *H02J 2007/0049* (2013.01); *H02J 2007/0096* (2013.01); *Y02B 40/90* (2013.01)

(58) Field of Classification Search
CPC ........ H02J 7/007; H02J 7/0047; H02J 7/0052; H02J 2007/0049; H02J 2007/0096
USPC .......................... 320/106, 108, 110, 160, 162
See application file for complete search history.

(56) References Cited

U.S. PATENT DOCUMENTS

| | | | |
|---|---|---|---|
| 5,350,993 A | 9/1994 | Toya et al. | |
| 5,565,756 A | 10/1996 | Urbish et al. | |
| 5,850,134 A | 12/1998 | Oh et al. | |
| 8,324,867 B2 | 12/2012 | Chen et al. | |
| 8,583,955 B2 | 11/2013 | Lu et al. | |
| 8,610,397 B2 | 12/2013 | Purdy et al. | |
| 9,065,157 B2 | 6/2015 | Van Wiemeersch et al. | |
| 2009/0153100 A1 | 6/2009 | Okumura et al. | |
| 2013/0086409 A1* | 4/2013 | Lu ........................ | H04L 12/2807 713/340 |
| 2013/0214730 A1 | 8/2013 | Lu et al. | |
| 2016/0028263 A1 | 1/2016 | Yau | |
| 2016/0134136 A1 | 5/2016 | Poulton | |

FOREIGN PATENT DOCUMENTS

| | | |
|---|---|---|
| CN | 201112502 Y | 9/2008 |
| CN | 201478855 U | 5/2010 |
| CN | 101599651 B | 12/2011 |
| CN | 104682506 A | 6/2015 |

(Continued)

OTHER PUBLICATIONS

Poulton, et al., "Wireless Communications Controlled Battery Charging Station", U.S. Appl. No. 15/006,595, filed Jan. 26, 2016.

(Continued)

*Primary Examiner* — Edward Tso
*Assistant Examiner* — Aaron Piggush
(74) *Attorney, Agent, or Firm* — Isaac J. Gooshaw

(57) ABSTRACT

An electronic device sends a wireless signal to a charging station indicating that charging of a battery of the electronics device is to commence. The electronic device determines whether charging of the battery is to continue. In response to a determination that charging of the battery is not to continue, the electronic device sends a wireless signal to the charging station indicating that charging of the battery is to cease.

20 Claims, 4 Drawing Sheets

(56) References Cited

FOREIGN PATENT DOCUMENTS

JP   2008136295 A   6/2008
KR   1020050102809 A   10/2005

OTHER PUBLICATIONS

Beak et al., "Energy Charging Circuits in Bluetooth Environment for Smart Phone", pp. 109-110, 2008 IEEE International Conference on Consumer Electronics (ICE), 978-1-4244-8712-7/11, © 2011 IEEE.

IBM et al., "Microprocessor Controlled Battery Charger", An IP.com Prior Art Database Technical Disclosure, Original Publication Date: Oct. 1, 1994, Original Disclosure Information: TDB v37 n10 10-94 p. 171-174, IP.com No. IPCOM000113824D, IP.com Electronic Publication: Mar. 27, 2005.

"Intelligent Method for Cell Phone Battery charging", An IP.com Prior Art Database Technical Disclosure, IP.com No. IPCOM000206854D, IP.com Electronic Publication: May 10, 2011, pp. 1-2.

\* cited by examiner

WIRELESS COMMUNICATION CONTROLLED BATTERY CHARGING STATION

FIELD OF THE INVENTION

The present invention relates generally to the field of rechargeable batteries, and more particularly to control of battery charging using wireless communication.

BACKGROUND OF THE INVENTION

Most battery charging devices provided with electronics devices, such as mobile phones and laptop computers, provide a fixed voltage source to recharge batteries. The required voltage and current profile for charging the battery is, in general, provided by electronic circuits, either within the charging device itself or within the battery. This allows flexibility in the choice of chargers and also serves to protect the device from potential damage from the use of inappropriate chargers.

Recently, there has been a move toward the use of wireless battery charging devices. Most wireless mobile charging solutions rely on inductive coupling. With inductive coupling, the charging station takes the form of a mat or other flat surface. Inside the mat are one or more inductive coupling coils. The mat itself is connected to an external source of power that is used to recharge the battery. Since the electricity coming to most homes is alternating current, the mat provides the electricity the coils need to generate a changing magnetic field. In some instances, a special case or attachment is connected to the electronics device to take advantage of this magnetic field and has a matching coil for the inductor coils. The electronics device is placed on the charging surface such that the coils overlap. The inductor coils inside the mat generates the magnetic field, which induces a flow of electricity inside the matching coil. This electricity then recharges the battery of the electronics device.

Another approach used by wireless battery charging devices utilizes conductive charging mats to transfer power when charging a battery. Conductive charging mats create a direct electric circuit between a mobile device and a charging surface. Typically, the surface of the charging device has strips of electrically conductive material embedded in it such that when a electronics device with corresponding electrical contacts touches these strips of metal, electricity flows into the battery of the electronics device.

SUMMARY

Embodiments of the present invention provide a method, system, and program product to charge a battery. An electronic device sends a wireless signal to a charging station indicating that charging of a battery of the electronic device is to commence. The electronic device determines whether charging of the battery is to continue. In response to a determination that charging of the battery is not to continue, the electronic device sends a wireless signal to the charging station indicating that charging of the battery is to cease.

DETAILED DESCRIPTION

Figure 1:
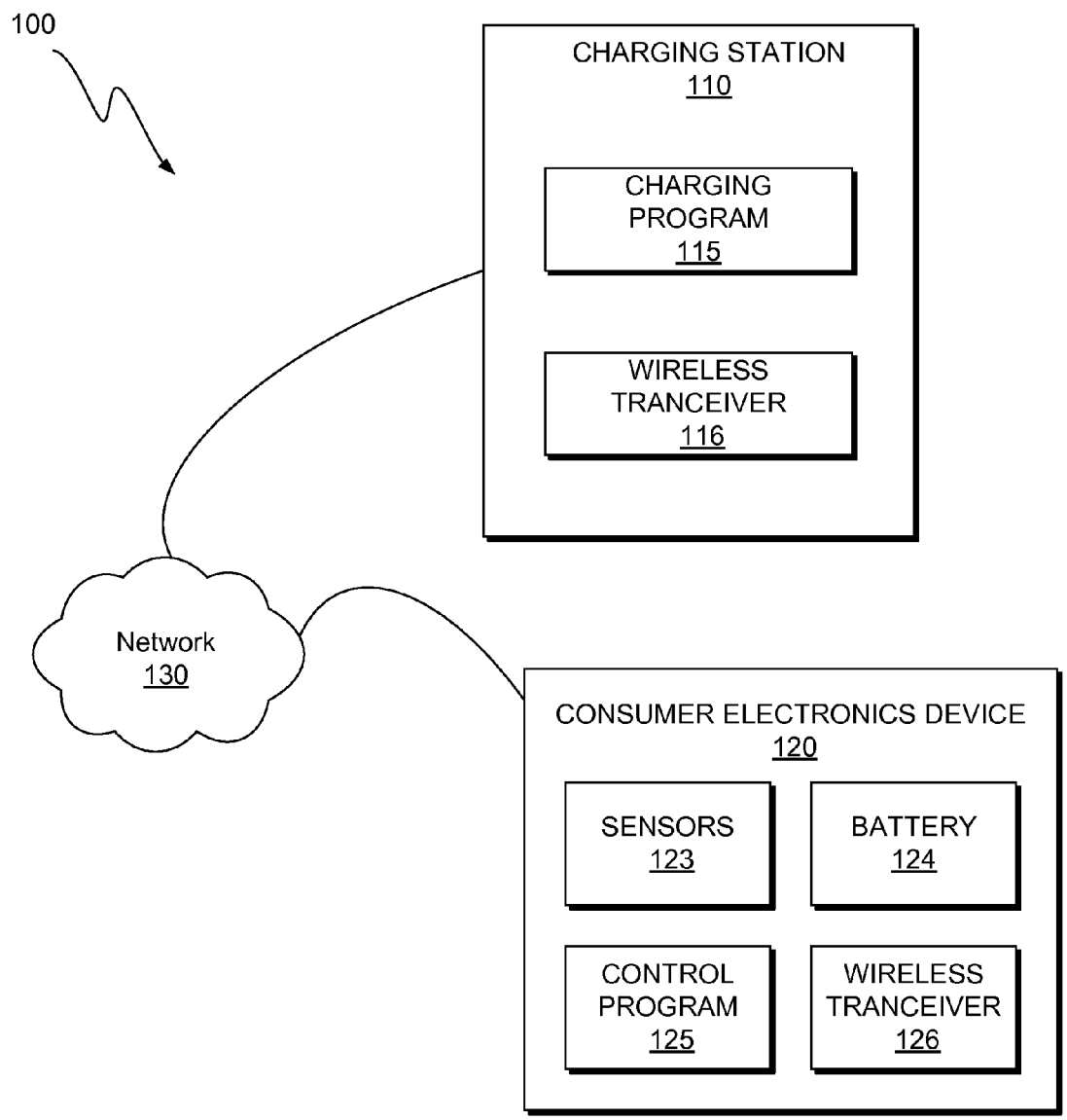
FIG. 1 is a functional block diagram illustrating a battery charging environment, in accordance with an exemplary embodiment of the present invention.

While solutions to control the charging of a battery of the electronics device are known they often require a physical or wired connection to do so. In some solutions, the battery charging device is configured to stop charging a battery once an amount of resistance is detected. Such battery charging devices normally incorporate some form of voltage regulation to control the charging voltage applied to the battery, to prevent overcharging of the battery. Many different charging and termination schemes have been developed for different battery chemistries and different applications. To control the point at which battery charging is terminated, several methods are commonly employed.

The first commonly employed method is a trickle charging method in which a small current charge (e.g., 0.05-0.1 coulomb) is applied to the battery at a constant voltage over a prolonged period of time, often ranging from 5-15 hours. Trickle charging means charging a fully charged battery under no-load at a rate equal to its self-discharge rate, thus enabling the battery to remain at its fully charged level. A related form of charging is float (or maintenance) charging. A simple definition of float charging is that voltage is continuously applied to the battery terminals. Typically, the amplitude of that voltage varies between 0.2 volts and 0.6 volts above the rest state voltage of the battery when it is fully charged. The purpose of continuous float charging is to maintain the battery in a fully charged condition so that when it is called into service, the battery will be able to deliver its full charge capacity. For lead-acid batteries under no-load float charging, i.e., the battery is not being used while it is being charged, trickle charging is achieved naturally at the end of charge, when the lead-acid battery takes in a trickle charge to keep itself fully charged. The trickle charging then equals the energy expended by the lead-acid battery in splitting the water in the electrolyte into hydrogen and oxygen gases. Other battery technologies, such as the lithium-ion technology, are highly intolerant to over-charging, and cannot be float charged without an external battery management system.

The second method is to monitor the change in voltage across the battery terminals using a voltage sensor. As the battery is charged the voltage rises until full charge is reached. Once full charge is reached the voltage across the battery terminals begins to drop (herein called negative delta voltage (NDV), where delta indicates change) due to polarization inside the cells of the battery, which starts to occur once a cell is fully charged. At this point the cells enter the overcharge danger zone and the temperature of the battery begins to rise rapidly since the chemical changes are complete and the excess electrical energy is converted into heat by the cells. In general, the rate of change of voltage with respect to time (dV/dt) is monitored and charging is stopped when this becomes zero, but this runs the risk of premature cutoffs. With this method, a much higher charging rate can be used than with the trickle method to charge at up to 1 C. At this charge rate, the cutoff NDV is approximately 5-10 mV per cell of the battery. Since this method measures the voltage across the battery, a constant current (rather than a constant voltage) charging circuit must be used. This is unlike a lead-acid battery cell for example, which can, in theory, be more easily charged at a suitably chosen constant voltage. The voltage drop occurs regardless of the discharge level or ambient temperature and it can therefore be detected and used by a battery charging device to identify the peak in voltage of the battery, and hence to cut off charging when the battery has reached its full charge. This method is not suitable for charging currents less than 0.5 C (coulomb) since changes in voltage becomes difficult to detect. False NDV can occur at the start of the charge with excessively discharged cells. This is often overcome by using a timer to delay the detection of NDV to avoid this problem. Lead acid batteries do not demonstrate a voltage drop on charge completion hence this charging method is not suitable for sealed lead acid (SLA) batteries.

Nickel-metal hydride (NiMH) batteries do not demonstrate such a pronounced NDV voltage drop when they reach the end of the charging cycle and so the NDV cut off method is not reliable for ending a NiMH battery charge. Instead, many battery charging devices sense the rate of increase of the battery temperature per unit time (dT/dt, indicating change in Temperature/change in time). When a predetermined rate (dT/dt) is reached, rapid charging at rates (0.5-1.0 C) is stopped and the charge method is switched to the trickle charge method. Because extended trickle charging can damage a NiMH battery, the use of a timer to regulate the total charging time is often recommended.

A constant-current constant-voltage (CC/CV) controlled charge method is often used for charging Lithium and some other batteries, which may be vulnerable to damage if the upper voltage limit is exceeded. The constant current charging rate specified by a manufacturer is the maximum charging rate which the battery can tolerate without damaging the battery. Special precautions are often needed to maximize the charging rate and to ensure that the battery is fully charged, while at the same time avoiding overcharging. For this reason, it is typically recommended that a battery charging device switch charging methods from constant-current to constant voltage charging before the cell voltage reaches its upper limit for that battery. Note that this implies that chargers for Lithium Ion battery cells must be capable of controlling both the charging current and the charging voltage, requiring sensors and devices for both.

Embodiments of the present invention recognize that with the advent of wireless chargers the battery voltage, current and temperature data required by many battery charging systems, to prevent overcharging of batteries, is not readily accessible to such battery charging systems. Embodiments of the present invention provide one or more of battery voltage, current and temperature data as required by many charging systems, without the use of wired communication connections between electronic devices and charging stations. Embodiments of the present invention provide an application installed on an electronic device that communicates wirelessly with the charging station to control the charging of the battery of that electronic device. An embodiment of the present invention provides a charging attachment that is connected to the electronic device that includes one or all of a) the application, b) the sensors to determine at least one of the battery voltage, current or temperature data, and c) an electrical power system to transfer electrical power to the battery. An embodiment of the present invention provides a charging attachment that stops the charging of the battery of electronic device once a predefined battery charge has been reached. An embodiment of the present invention provides a charging station that wirelessly receives and processes commands from an electronic device to control charging of the battery of that electronic device.

The present invention will now be described in detail with reference to the Figures.

FIG. 1 is a functional block diagram illustrating a battery charging environment, generally designated 100, in accordance with one embodiment of the present invention. Battery charging environment 100 includes charging station 110 and electronics device 120 connected over wireless network 130. Charging station 110 includes charging program 115 and wireless transceiver 116. Consumer electronics device 120 includes sensors 123, battery 124, control program 125 and wireless transceiver 126.

In general, charging station 110 is configured to wirelessly transmit energy to electronics device 120 to charge battery 124 and electronics device 120 is configured to receive that transmitted energy. Together, charging station 110 and electronics device 120 comprise a battery charging system. For example, if electronics device 120 utilizes inductive coupling to charge battery 124, then charging station 110 has a complementary coil and power system that generates the changing magnetic field to transmit energy to the complementary coil of electronics device 120. In some embodiments, such complementary structures are included as part of an attachment connected to electronics device 120 and/or charging station 110. In some embodiments, one or more of sensors 123, battery 124, control program 125, wireless transceiver 126, charging program 115 and wireless transceiver 116 are included in respective attachments connected to electronics device 120 and/or charging station 110, further respectively. In a charging scenario where battery 124 is being charged, electronics device 120 is within a proximity to charging station 110 such that power is transmitted from charging station 110 and is received by electronics device 120. In some embodiments, such a proximity varies with the type of wireless power transfer technology respectively used by charging station 110 and electronics device 120.

In this exemplary embodiment, charging program 115 and control program 125 are respectively stored on charging station 110 and electronics device 120. However, in other embodiments, one or both of charging program 115 and control program 125 are stored externally, in whole or in part, and are accessed through a communication network, such as network 130. Network 130 can be, for example, a local area network (LAN), a wide area network (WAN) such as the Internet, or a combination of the two, and may include wired, wireless, fiber optic or any other connection known in the art. In general, network 130 can be any combination of connections and protocols that will support communications between charging program 115, wireless transceiver 116, control program 125, wireless transceiver 126, charging station 110 and electronics device 120, in accordance with a desired embodiment of the present invention.

In general, wireless transceiver 126 and wireless transceiver 116 allow wireless communication between charging station 110 and electronics device 120. In various embodiments, wireless transceiver 126 and wireless transceiver 116 utilize one or more of: radio communication, microwave communication, for example long-range line-of-sight via highly directional antennas, or short-range communication, free-space optical communication (FSO) communication, which uses light propagating in free space to wirelessly transmit data, sonic communication, including ultrasonic short range communication, which involves the transmission and reception of sound, and electromagnetic induction short range communication. In general, wireless transceiver 126 and wireless transceiver 116 utilize a form of wireless communication and an accompanying data/signal format to provide wireless communication between charging program 115 and control program 125.

In various embodiments of the present invention, electronics device 120 is a portable electronic device that can be a standalone device, a laptop computer, a tablet computer, a netbook computer, a smartphone, a handheld video game console or another portable electronic device known in the art. In another embodiment, electronics device 120 represents a computing system utilizing clustered computers and components to act as a single pool of seamless resources. In general, electronics device 120 can be any computing device or a combination of devices with access to sensors 123, battery 124, control program 125 and wireless transceiver 126 and is capable of both executing control program 125 and of receiving power from charging station 110 to charge battery 124. In some embodiments, electronics device 120 includes internal and external hardware components, as depicted and described in further detail with respect to FIG. 4.

In various embodiments of the present invention, charging station 110 is a battery charging station that is configured to provide power to wirelessly charge battery 124 of electronics device 120. In some embodiments, charging station 110 utilizes inductive coupling to provide power to wirelessly charge the battery of electronics device 120. In some embodiments, charging station 110 utilizes conductive charging mats to create a direct electric circuit between electronics device 120 and a charging surface of charging station 110. In one embodiment, such a charging surface has strips of electrically conductive material embedded in the charging surface such that when electronics device 120 touches these strips of metal, electricity flows into battery 124. In general, charging station 110 can be any charging device or a combination of charging and computing devices with access to charging program 115 and wireless transceiver 116 and are capable of both executing charging program 115 and of transmitting power to electronics device 120 to charge battery 124. In some embodiments, charging station 110 includes internal and external hardware components, as depicted and described in further detail with respect to FIG. 4.

In an embodiment, charging station 110 includes charging program 115. In general, charging program 115 responds to the commands sent by control program 125 to regulate charging of battery 124. In some embodiments, charging program 115 is hardwired into an electronic circuit in communication with wireless transceiver 116. In other embodiments, charging program 115 is stored on a memory of charging station 110 and is accessed and executed using internal and external hardware components, as depicted and described in further detail with respect to FIG. 4.

In an embodiment, electronics device 120 includes control program 125. Control program 125 receives data from sensors 123, which monitor the charge of or charging of battery 124. In an embodiment, in general, battery 124 is a rechargeable battery with known charging characteristics. Control program 125 includes a number of known profiles for a variety of batteries. Control program 125 uses these profiles to identify the type of battery represented by battery 124 and selects a charging profile to match the identified type. For example, if battery 124 is a sealed lead acid battery, then control program 125 would identify the type of battery as a sealed lead acid battery and select a charging profile to match.

In some instances, control program 125 communicates with electronic device 120 and retrieves data identifying the type of battery represented by battery 124. In other cases, control program 125 executes a test based on a partial charge of battery 124 to identify the type of battery 124. For example, control program 125 executes a short recharge of battery 124 in which control program 125 causes charging station 110 to vary the voltage used for charging over a range with a constant current followed by a constant voltage with a varied electrical current. During the test, control program 125 uses sensors 123 to monitor the characteristics of battery 124, e.g., changes in voltage across the terminals, change in temperature, electrical resistance etc. Control program 125 uses these characteristics to generate a charging profile for battery 124 and matches this profile to a profile included in control program 125, thereby identifying the type of battery 124.

In an embodiment, sensors 123 monitor one or more of: voltage, electrical current (also called amperage when current is measured in amperes), electrical resistance, temperature or another characteristic, as is known to those skilled in the art, of battery 124. In general, control program 125 uses the data generated by sensors 123 to determine commands to send to charging program 115 to control the charging of battery 124. In one embodiment, control program 125 is, at least in part, included as part of a protocol stack that is an implementation of a computer networking protocol suite. Such protocol stacks include one or more protocols and layers to pass signals from control program 125 to charging program 115.

In one embodiment, control program 125 uses a peripheral device, such as the flash of a camera included in electronics device 120, to send a signal to charging program 115. In such an embodiment, charging station 110 includes a sensor that detects the signal from the peripheral device, e.g., a light sensor, and changes the charging of battery 124 in accordance to the received signal. For example, control program 125 activates a camera flash of electronics device 120 three times with the flashes spaced one second apart. In one such embodiment, a light detector, included as part of charging station 110, receives the flashes of light and sends the signals to charging program 115. Charging program 115 matches the signal pattern to an index of charging commands and determines that the signal indicates that charging of battery 124 is to be conducted using a trickle method governed by a timer. As such, charging station initiates a charging of battery 124 using the trickle method and, once the time period has elapsed, ceases further charging.

In another embodiment, electronics device 120 uses a screen display, e.g., a screen on a smartphone, to communicate with charging station 110. In one such embodiment, electronics device 120 uses the screen to display a pattern or sequence of patterns to charging station 110. As with the pervious embodiment, charging station 110 includes a sensor configured to detect signals from electronics device 120, e.g., a camera, which detects the signals from the screen of electronics device 120, and passes those signals to charging program 115. Charging program 115 matches the signal pattern to an index and determines the charging to be applied to recharge battery 124. Such patterns could be barcodes, color patterns or a sequence of pictures that are recognized by charging program 115.

Figure 2:
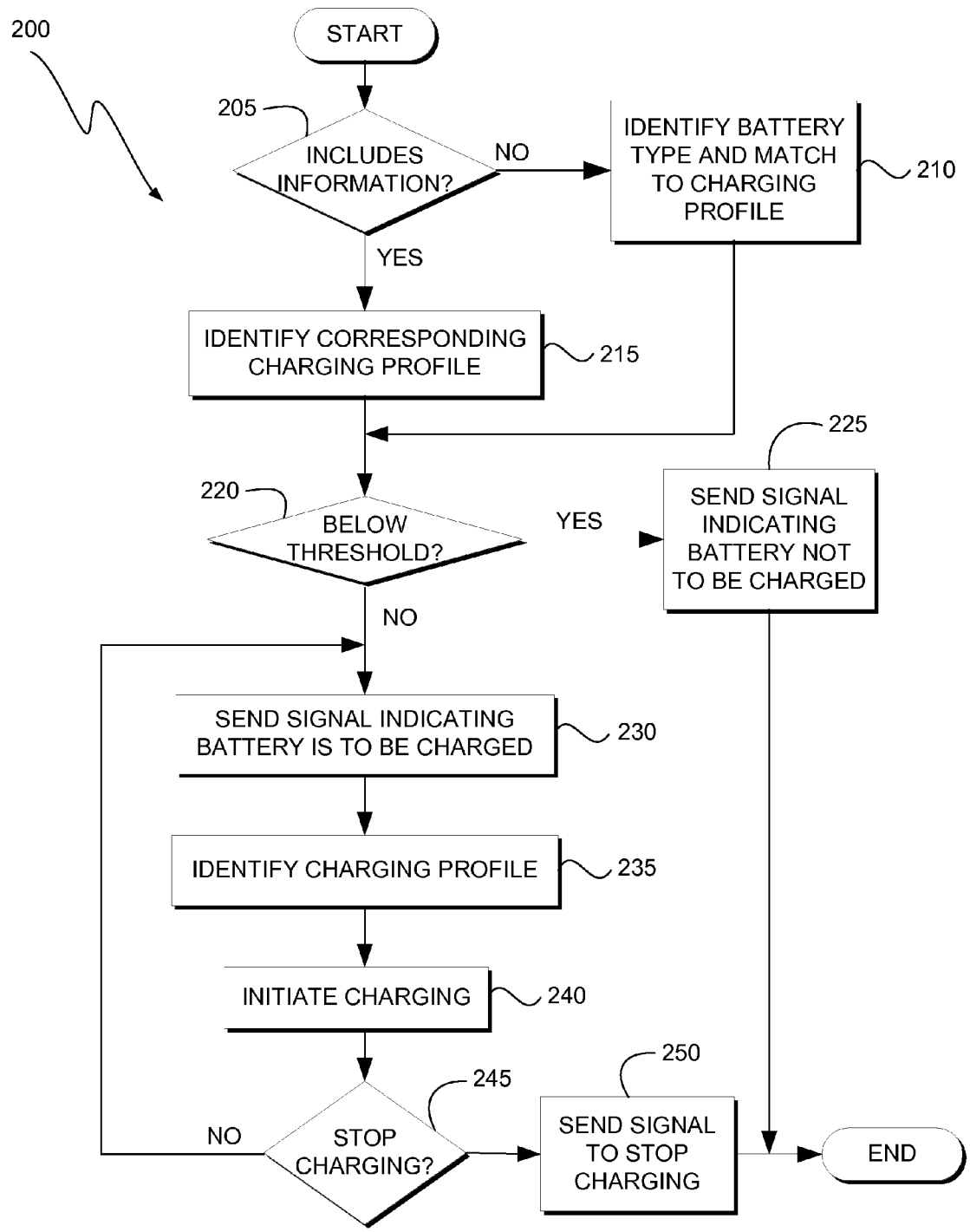
FIG. 2 illustrates operational processes of a control program, executing on an electronics device within the environment of FIG. 1, in accordance with an exemplary embodiment of the present invention.

FIG. 2 illustrates operational processes of control program 125, executing on electronics device 120 within the environment of FIG. 1, in accordance with an exemplary embodiment of the present invention.

In determination process 205, control program 125 determines if electronics device 120 includes information identifying the type of battery that battery 124 belongs to, e.g., a rechargeable nickel-cadmium battery. If electronics device 120 does not include information identifying the type of battery that battery 124 belongs to (determination process 205, NO branch), then control program 125 proceeds to process 210. In process 210, control program 125 identifies the type of battery that battery 124 belongs by executing a charging test and generates a charging profile based on the results of that test, which is then matched to a pre-existing charging profile included in control program 125. Such charging tests include charging and/or discharging battery 124 at least partly and monitoring one or more of voltage, current, temperature and resistance, as would be understood by one skilled in the art. In some embodiments, once control program 125 tests a battery and identifies a type of battery of battery 124, control program 125 creates a record of the type of battery of battery 124 and stores that information for use in future charging. If electronics device 120 does include information identifying the type of battery that battery 124 belongs to (determination process 205, YES branch), then control program 125 identifies the corresponding pre-existing charging profile for that battery type, included in control program 125, in process 215. In process 215, control program 125 compares information identifying the type of battery of battery 124 to a number of entries in a database, which is included as part of control program 125. Control program 125 matches the information to one of the entries included in the database and retrieves a pre-existing charging profile that is associated with that entry. In one embodiment, each entry included in such a database is associated with a type of battery chemistry, e.g., lead-acid battery. In addition, the pre-existing charging profile for that battery type is configured such that the charging of that battery type will be completed with a minimization of overcharging and/or reduction in degradation of the battery due to charging.

In determination process 220, control program 125 determines whether the amount of charging to be applied to battery 124 is below a threshold. Certain types of batteries, e.g., certain lithium based batteries, are susceptible to decreased lifespan by unnecessary charging. As such, control program 125 determines whether the current level of charge of battery 124 warrants charging as part of determination process 220. If the amount of charging to be applied to battery 124 is below a threshold (determination process 220, YES branch), then control program 125 signals charging station 110 indicating that battery 124 is not to be charged, in process 225. For example, in some scenarios the amount of charging to be applied to battery 124 is determined to be zero, e.g., in the case where the battery is fully charged. In such a case, control program 125 signals charging station 110 indicating that battery 124 is not to be charged.

If the amount of charging to be applied to battery 124 is not below a threshold (determination process 220, NO branch), then control program 125 signals charging station 110 indicating that battery 124 is to be charged, in process 230.

In process 235, control program 125 identifies a charging profile to be followed to recharge battery 124 and sends a signal to charging station 110 to indicate the charging profile to be applied when charging battery 124. In some scenarios the charging profile to be followed is based on the type of battery to which battery 124 belongs. In other scenarios, the charging profile to be followed is based on both the type of battery to which battery 124 belongs as well as the amount of charging that is to be applied to battery 124. For example, control program 125 determines the amount of charging to be applied to battery 124 to be a non-zero value that exceeds the threshold, e.g., battery 124 is 15% charged, and battery 124 is determined to be of a lithium type of battery. As such, control program 125 signals charging station 110 indicating that battery 124 is to be charged according to the charging profile for a lithium type of battery that is in a low charge state. As such the charging profile applied takes into account the type of battery as well as the amount of charge required to bring the battery above a threshold.

In process 240, control program 125 initiates charging of battery 124 via wireless transceiver 126. To charge battery 124, control program 125 sends a signal, using wireless transceiver 126, to charging station 110, initiating the execution of the charging profile to be followed to charge battery 124. In determination process 245, control program 125 determines whether to stop the charging of battery 124 based on the data being output by sensors 123. If control program 125 determines to stop the charging of battery 124 based on the data being output by sensors 123 (determination process 245, YES branch), then control program 125 sends a signal to charging station 110 indicating that charging activity is to stop, in process 250. For example, in response to the data being output by sensors 123 indicating that charging of battery 124 is complete or is to cease due to a problem in the charging of battery 124, control program 125 sends a signal to charging station 110 indicating that charging activity is to stop. If control program 125 determines not to stop the charging of battery 124 based on the data being output by sensors 123 (determination process 245, NO branch), then control program 125 returns to process 230 and sends a signal to charging station 110 indicating that charging activity is to continue, i.e., is to be charged. For example, the data being output by sensors 123 indicates that charging of battery 124 is not complete and, as a result, control program 125 continues to send signals to charging station 110 indicating that battery 124 is to be charged using charging profile X.

In some embodiments, by returning to process 230, control program 125 dynamically changes the charging profile being applied to charge battery 124 based on the data being output by sensors 123. For example, battery 124 is brought up to 70% charge using charging profile A and then brought to full charge using charging profile B. In certain embodiments, the use of multiple charging profiles allows for a more timely and efficient charge with reduced degradation of battery 124.

In one embodiment, control program 125 also includes the capability to stop the flow of electricity charging battery 124 in the event that charging station 110 does not respond to signals indicating that charging activity is to stop. In one embodiment, control program 125 also includes the capability to stop the flow of electricity charging battery 124 in the event that charging station 110 malfunctions. For example, charging station 110 applies an undesirable charging profile to charge battery 124.

Figure 3:
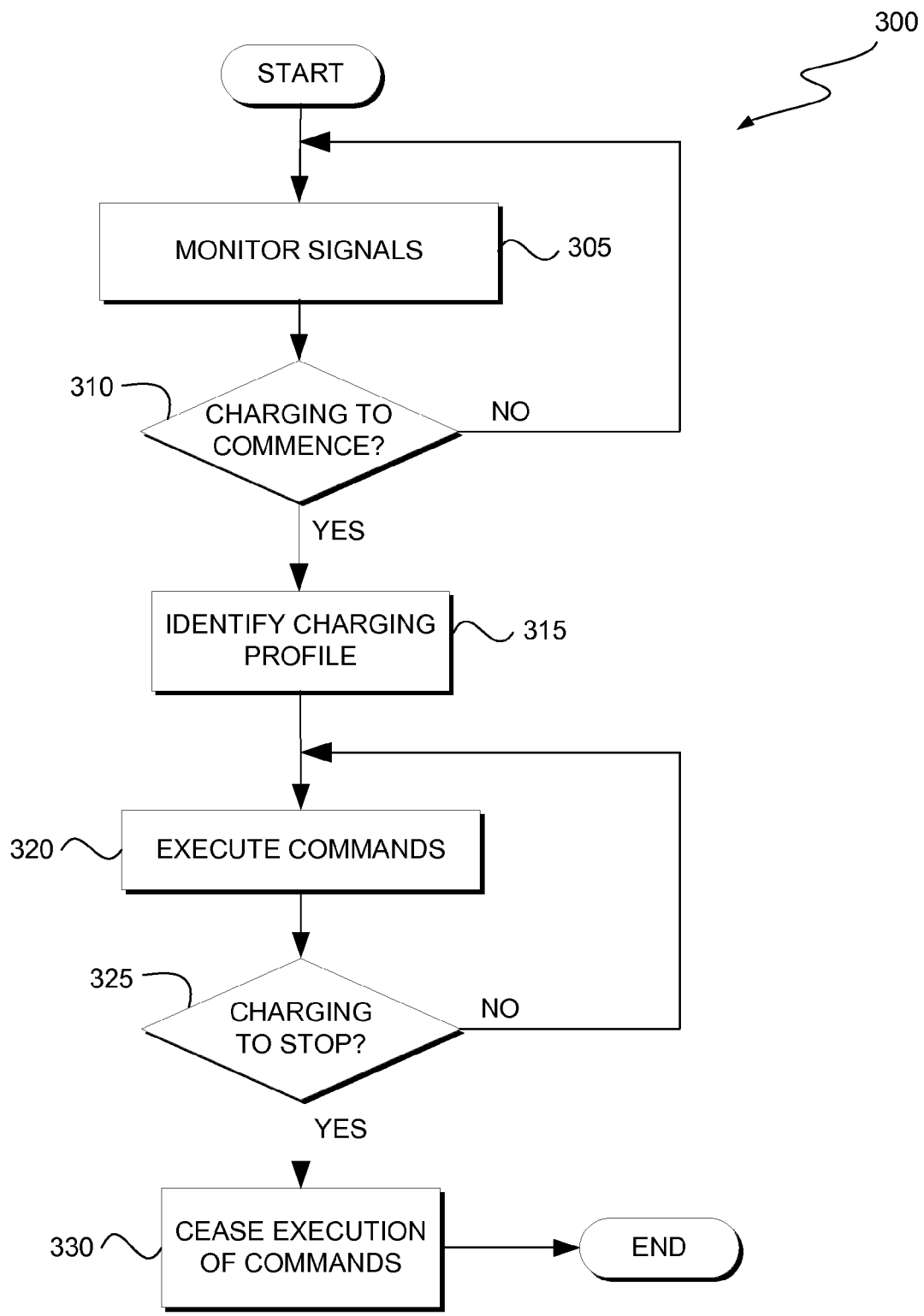
FIG. 3 illustrates operational processes of a charging program, executing on a charging station within the environment of FIG. 1, in accordance with an exemplary embodiment of the present invention.

FIG. 3 illustrates operational processes of charging program 115, executing on charging station 110 within the environment of FIG. 1, in accordance with an exemplary embodiment of the present invention.

In process 305, charging program 115 monitors the signals from control program 125 via wireless transceiver 116. In determination process 310, charging program 115 determines if the signals indicate that charging of battery 124 is to commence. If the signals indicate that charging of battery 124 is not to commence (determination process 310, NO branch), then charging program 115 returns to process 305.

If the signals indicate that charging of battery 124 is to commence (determination process 310, YES branch), then charging program 115 identifies a charging profile based on the signals from control program 125, in process 315. In process 315, charging program 115 identifies a charging profile to be applied to battery 124 by matching the signal received from control program 125 to a list of charging profiles, which include commands that control the power used by charging station 110 to charge battery 124. Such commands are included as part of charging program 115.

In process 320, charging program 115 executes the commands based on the signals received from control program 125 according to the charging profile that was matched to the signals from control program 125. Such commands indicate the voltage and electric current that are to be applied to battery 124 in order to recharge it.

In decision process 325, charging program 115 determines if a signal has been received from control program 125 indicating that charging activity is to stop. If a signal has not been received from control program 125 indicating that charging activity is to stop (decision process 325, NO branch), then charging program 115 returns to process 320 and continues to execute the commands included in the charging profile. If a signal has been received from control program 125 indicating that charging activity is to stop (decision process 325, YES branch), then charging program 115 ceases to execute the commands included in the charging profile in process 330, i.e., charging program 115 ceases to supply voltage and electric current to battery 124 in order to recharge it.

Figure 4:
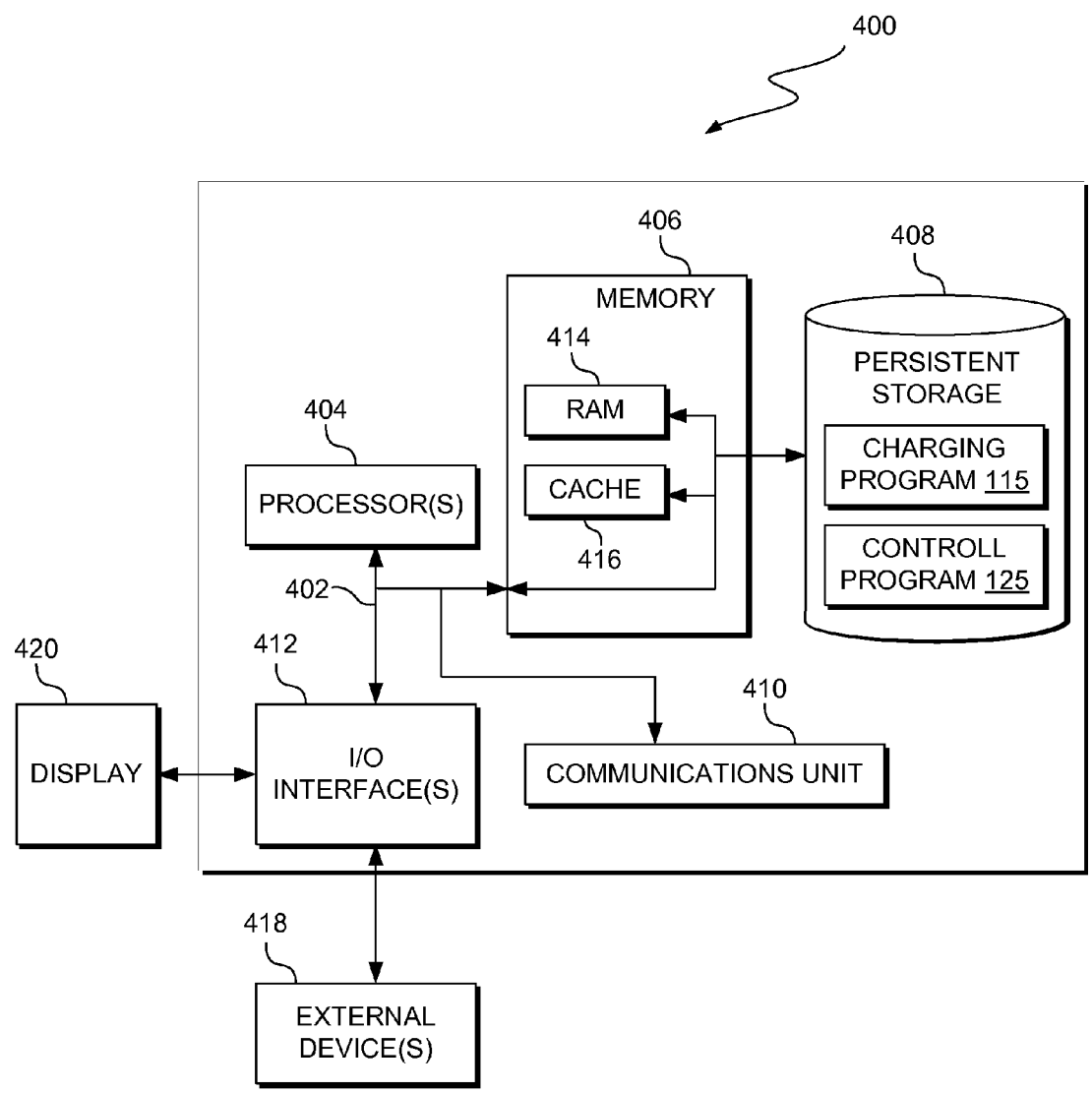
FIG. 4 depicts a block diagram of components of the electronics device executing the control program and the charging station executing the charging program, in accordance with an exemplary embodiment of the present invention.

FIG. 4 depicts a block diagram of components of electronics device 120 executing the control program 125 and charging station 110 executing charging program 115, in accordance with an exemplary embodiment of the present invention. It should be appreciated that FIG. 4 provides only an illustration of one implementation and does not imply any limitations with regard to the environments in which different embodiments may be implemented. Many modifications to the depicted environment may be made.

Consumer electronics device 120 and charging station 110 respectively include communications fabric 402, which provides communications between further respective computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes respective random access memory (RAM) 414 and cache memory 416. In general, memory 406 can include any suitable volatile or non-volatile computer-readable storage media.

Control program 125 and charging program 115 are stored in respective persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices, including resources of network 130. In these examples, communications unit 410 includes one or more network interface cards. Communications unit 410 may provide communications through the use of either or both physical and wireless communications links. Control program 125 and charging program 115 may be downloaded to persistent storage 408 through communications unit 410.

I/O interface(s) 412 allows for input and output of data with other devices that may be respectively connected to electronics device 120 and charging station 110. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention, e.g., control program 125 and charging program 115, can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) "Smalltalk" and the like may be subject to trademark rights in various jurisdictions throughout the world and are used here only in reference to the products or services properly denominated by the marks to the extent that such trademark rights may exist.

What is claimed is:

1. A method to charge a battery, the method comprising:
    sending, by an electronic device, a wireless signal to an inductive charging station indicating that inductive charging of a battery of the electronic device is to commence, wherein the inductive charging station is configured to generate an electromagnetic field and the electronic device is configured to convert at least a portion of that electromagnetic field into electrical current;
    executing, by the electronic device, a test of the battery using the inductive charging station, wherein the test (i) generates data for a first period of inductive charging of the battery and (ii) partially charges the battery;
    generating, by the electronic device, a profile of the battery based on data generated during the first period of inductive charging, wherein the profile indicates a possible type of the battery;

initiating, by the electronic device, a second period of inductive charging of the battery using a first type of inductive charging that is associated with the possible type of the battery;

determining, by the electronic device, whether the first type of inductive charging of the battery is to continue based on a match, to within a threshold, between (i) determined changes in characteristics of the battery during the second period of inductive charging and (ii) expected changes in characteristics during charging for the possible type of the battery; and responsive to a determination that inductive charging of the battery is not to continue, sending, by the electronic device, a wireless signal to the inductive charging station indicating that inductive charging of the battery is to cease.

2. The method of claim 1, the method further comprising:

determining, by the electronic device, that a type of the battery is indicated by a pre-existing charging profile included in the electronic device; and determining a type of inductive charging to be applied during the test based, in part, on the pre-existing charging profile.

3. The method of claim 2, the method further comprising:

generating, by the electronic device, an expected charging profile of the battery based, at least in part, on a result of the test, wherein the expected charging profile includes expected changes in physical and electrical characteristics during charging for the possible type of the battery.

4. The method of claim 1, further comprising:

determining, by the electronic device, a configuration for the second period of inductive charging based, at least in part, on a determined amount of inductive charging to be applied to the battery such that a predefined charge of the battery is reached.

5. The method of claim 1, the method further comprising:

responsive to a determination that a threshold degree of mismatch exist between (i) determined changes in characteristics of the battery during the second period of inductive charging and (ii) expected changes in characteristics during charging for the possible type of the battery, determining, by the electronic device, (i) a third type of inductive charging to be applied to the battery and (ii) a third time period of inductive charging such that a predicted charge of the battery after the third period will exceed a threshold, wherein the third type of inductive charging is indicated by a wireless signal sent to the inductive charging station.

6. The method of claim 1, wherein a determination of whether inductive charging of the battery is to continue is further based on a threshold for a characteristic of the battery being exceeded, the threshold being (i) based on the profile of the battery and (ii) configured for at least one of a temperature of the battery, a voltage of the battery, an electrical current of the battery, or a resistance of the battery.

7. The method of claim 4, the method further comprising:

responsive to a determination that the predefined charge of the battery has not been reached, sending, by the electronic device, a wireless signal to the inductive charging station indicating that inductive charging of the battery is to continue.

8. A computer program product to charge a battery, the computer program product comprising:

one or more computer-readable storage media and program instructions stored on the one or more computer-readable storage media, the program instructions comprising:

program instructions to send a wireless signal to an inductive charging station indicating that inductive charging of a battery of the electronic device is to commence, wherein the inductive charging station is configured to generate an electromagnetic field and the electronic device is configured to convert at least a portion of that electromagnetic field into electrical current;

program instructions to execute a test of the battery using the inductive charging station, wherein the test (i) generates data for a first period of inductive charging of the battery and (ii) partially charges the battery;

program instructions to generate a profile of the battery based on data generated during the first period of inductive charging, wherein the profile indicates a possible type of the battery;

program instructions to initiate a second period of inductive charging of the battery using a first type of inductive charging that is associated with the possible type of the battery;

program instructions to determine whether the first type of inductive charging of the battery is to continue based on a match, to within a threshold, between (i) determined changes in characteristics of the battery during the second period of inductive charging and (ii) expected changes in characteristics during charging for the possible type of the battery; and program instructions to respond to a determination that inductive charging of the battery is not to continue by sending a wireless signal to the inductive charging station indicating that inductive charging of the battery is to cease.

9. The computer program product of claim 8, the program instructions further comprising:

program instructions to determine that a type of the battery is indicated by a pre-existing charging profile included in the electronic device; and program instructions to determine a type of inductive charging to be applied during the test based, in part, on the pre-existing charging profile.

10. The computer program product of claim 9, the program instructions further comprising:

program instructions to generate an expected charging profile of the battery based, at least in part, on a result of the test, wherein the expected charging profile includes expected changes in physical and electrical characteristics during charging for the possible type of the battery.

11. The computer program product of claim 8, the program instructions further comprising:

program instructions to determine a configuration for the second period of inductive charging based, at least in part, on a determined amount of inductive charging to be applied to the battery such that a predefined charge of the battery is reached.

12. The computer program product of claim 8, the program instructions further comprising:

program instructions to respond to a determination that a threshold degree of mismatch exist between (i) determined changes in characteristics of the battery during the second period of inductive charging and (ii) expected changes in characteristics during charging for the possible type of the battery by determining (i) a third type of inductive charging to be applied to the battery and (ii) a third time period of inductive charging such that a predicted charge of the battery after the third period will exceed a threshold, wherein the third type of inductive charging is indicated by a wireless signal sent to the inductive charging station.

13. The computer program product of claim 8, wherein determination of whether inductive charging of the battery is to continue is further based on a threshold for a characteristic of the battery being exceeded, the threshold being (i) based on the profile of the battery and (ii) configured for at least one of a temperature of the battery, a voltage of the battery, an electrical current of the battery, or a resistance of the battery.

14. The computer program product of claim 11, the program instructions further comprising:
program instructions to respond to a determination that the predefined charge of the battery has not been reached by sending a wireless signal to the inductive charging station indicating that inductive charging of the battery is to continue.

15. A computer system to charge a battery, the computer system comprising:
one or more computer processors;
one or more computer readable storage medium;
program instructions to send a wireless signal to an inductive charging station indicating that inductive charging of a battery of the electronic device is to commence, wherein the inductive charging station is configured to generate an electromagnetic field and the electronic device is configured to convert at least a portion of that electromagnetic field into electrical current;
program instructions to execute a test of the battery using the inductive charging station, wherein the test (i) generates data for a first period of inductive charging of the battery and (ii) partially charges the battery;
program instructions to generate a profile of the battery based on data generated during the first period of inductive charging, wherein the profile indicates a possible type of the battery;
program instructions to initiate a second period of inductive charging of the battery using a first type of inductive charging that is associated with the possible type of the battery;
program instructions to determine whether the first type of inductive charging of the battery is to continue based on a match, to within a threshold, between (i) determined changes in characteristics of the battery during the second period of inductive charging and (ii) expected changes in characteristics during charging for the possible type of the battery; and
program instructions to respond to a determination that inductive charging of the battery is not to continue by sending a wireless signal to the inductive charging station indicating that inductive charging of the battery is to cease.

16. The computer system of claim 15, the program instructions further comprising:
program instructions to determine that a type of the battery is indicated by a pre-existing charging profile included in the electronic device; and
program instructions to determine a type of inductive charging to be applied during the test based, in part, on the pre-existing charging profile.

17. The computer system of claim 16, the program instructions further comprising:
program instructions to generate an expected charging profile of the battery based, at least in part, on a result of the test, wherein the expected charging profile includes expected changes in physical and electrical characteristics during charging for the possible type of the battery.

18. The computer system of claim 15, the program instructions further comprising:
program instructions to determine a configuration for the second period of inductive charging based, at least in part, on a determined amount of inductive charging to be applied to the battery such that a predefined charge of the battery is reached.

19. The computer system of claim 15, the program instructions further comprising:
program instructions to respond to a determination that a threshold degree of mismatch exist between (i) determined changes in characteristics of the battery during the second period of inductive charging and (ii) expected changes in characteristics during charging for the possible type of the battery by determining (i) a third type of inductive charging to be applied to the battery and (ii) a third time period of inductive charging such that a predicted charge of the battery after the third period will exceed a threshold, wherein the third type of inductive charging is indicated by a wireless signal sent to the inductive charging station.

20. The computer system of claim 15, wherein determination of whether inductive charging of the battery is to continue is further based on a threshold for a characteristic of the battery being exceeded, the threshold being (i) based on the profile of the battery and (ii) configured for at least one of a temperature of the battery, a voltage of the battery, an electrical current of the battery, or a resistance of the battery.

* * * * *